(12) United States Patent
Goel et al.

(10) Patent No.: US 9,647,028 B2
(45) Date of Patent: May 9, 2017

(54) WAFER ON WAFER STACK METHOD OF FORMING AND METHOD OF USING THE SAME

(71) Applicant: TAIWAN SEMICONDUCTOR MANUFACTURING COMPANY, LTD., Hsinchu (TW)

(72) Inventors: Sandeep Kumar Goel, Dublin, CA (US); Yun-Han Lee, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/194,961

(22) Filed: Jun. 28, 2016

(65) Prior Publication Data

US 2016/0307958 A1  Oct. 20, 2016

Related U.S. Application Data

(62) Division of application No. 14/458,873, filed on Aug. 13, 2014, now Pat. No. 9,391,110.

(51) Int. Cl.
| | |
|---|---|
| *H01L 21/50* | (2006.01) |
| *H01L 27/146* | (2006.01) |
| *H01L 21/78* | (2006.01) |
| *H01L 25/00* | (2006.01) |
| *H04N 5/367* | (2011.01) |
| *H04N 5/378* | (2011.01) |

(52) U.S. Cl.
CPC ........ *H01L 27/14687* (2013.01); *H01L 21/78* (2013.01); *H01L 25/50* (2013.01); *H01L 27/1469* (2013.01); *H01L 27/14609* (2013.01); *H01L 27/14632* (2013.01); *H01L 27/14634* (2013.01); *H04N 5/367* (2013.01); *H04N 5/378* (2013.01)

(58) Field of Classification Search
CPC ......... H01L 27/14687; H01L 27/14632; H01L 21/78; H01L 25/50; H01L 27/1469
USPC ........................................................ 438/109
See application file for complete search history.

(56) References Cited

U.S. PATENT DOCUMENTS

| | | | |
|---|---|---|---|
| 8,378,500 B2* | 2/2013 | Choi | ........................ H01L 24/14 257/738 |
| 8,637,800 B2 | 1/2014 | Kozlowski | |
| 8,674,470 B1 | 3/2014 | Or-Bach | |
| 9,484,387 B2* | 11/2016 | Shizukuishi | ........ H01L 27/0296 |

(Continued)

*Primary Examiner* — Luan C Thai
(74) *Attorney, Agent, or Firm* — Hauptman Ham, LLP

(57) ABSTRACT

A method of forming a wafer on wafer (WOW) stack includes forming a predetermined array of connecting elements on a surface of a first wafer, the first wafer including dies of a first type. The dies of the first type have a first functionality. The method further includes bonding a second wafer to the first wafer using the predetermined array of connecting elements, the second wafer including dies of a second type. The dies of the second type have a separate functionality different from the first functionality. Bonding the second wafer to the first wafer comprises bonding an integer number of dies of the second type to a corresponding die of the first type. A total area of the dies of the second type bonded to the corresponding die of the first type is less than or equal to an area of the corresponding die of the first type.

20 Claims, 10 Drawing Sheets

(56) References Cited

U.S. PATENT DOCUMENTS

| | | | | |
|---|---|---|---|---|
| 2009/0283898 A1* | 11/2009 | Janzen | ............ | H01L 21/76898 257/698 |
| 2014/0240566 A1* | 8/2014 | Shizukuishi | ...... | H01L 27/14634 348/302 |
| 2015/0279881 A1 | 10/2015 | Shizukuishi | | |

* cited by examiner

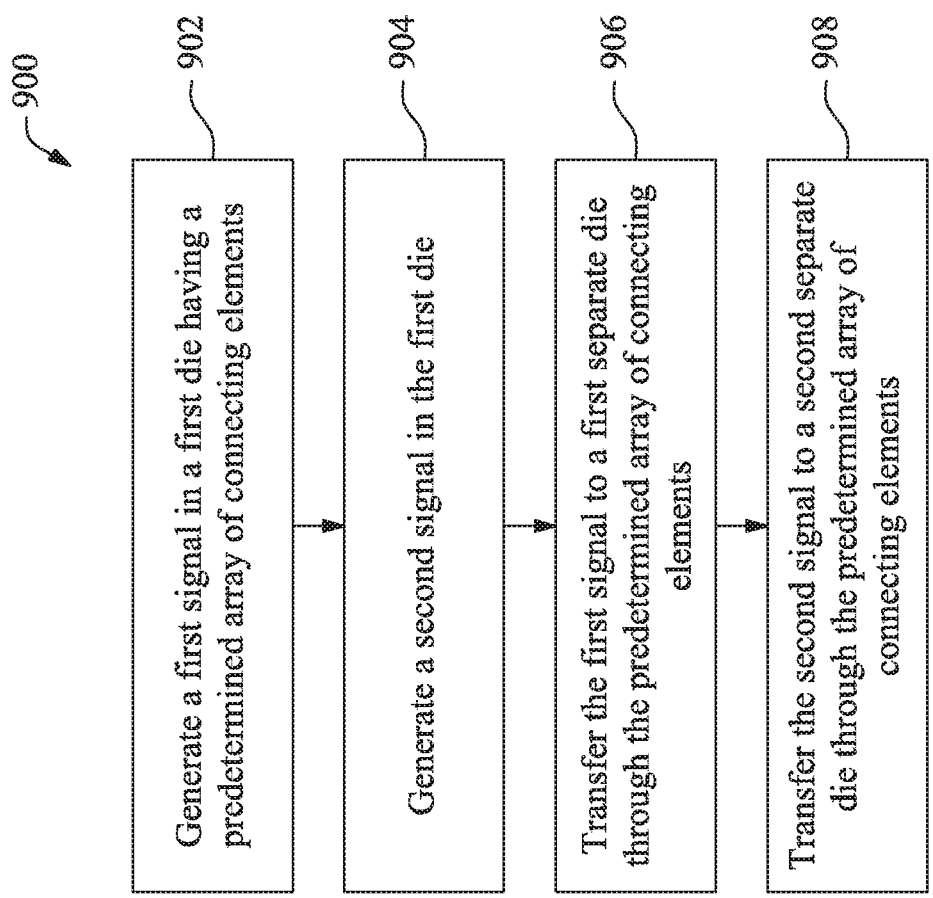

WAFER ON WAFER STACK METHOD OF FORMING AND METHOD OF USING THE SAME

PRIORITY CLAIM

This application is a divisional of U.S. application Ser. No. 14/458,873, filed Aug. 13, 2014, which is incorporated herein by reference in its entirety.

RELATED APPLICATION

This application is related to U.S. application Ser. No. 14/458,815, filed Aug. 13, 2014, which is incorporated herein in its entirety.

BACKGROUND

Three-dimensional integrated circuits (3DICs) include a plurality dies stacked atop one another. In some approaches, a first wafer including a plurality of a first type of dies is bonded to a second wafer including plurality of a second type of dies. A functionality of the first type of die is different from a functionality of the second type of die. Each first type of die is aligned with a corresponding second type of die and electrical connections are formed between the first type of die and the second type of die by bonding the first wafer to the second wafer. The bonded wafers are then sawed and separated die stacks are usable with other components of a 3DIC.

A size of each first type of die closely matches a size of the corresponding second type of die, and the dies are bonded in a 1:1 ratio. Non-overlapping areas of the each of the first type of dies or the corresponding second type of die are filled with fill materials, such as an underfill material, a molding compound, a dielectric material or another such material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart of a method of using a circuit formed using a WOW stack in accordance with some embodiments.

DETAILED DESCRIPTION

Figure 1A:
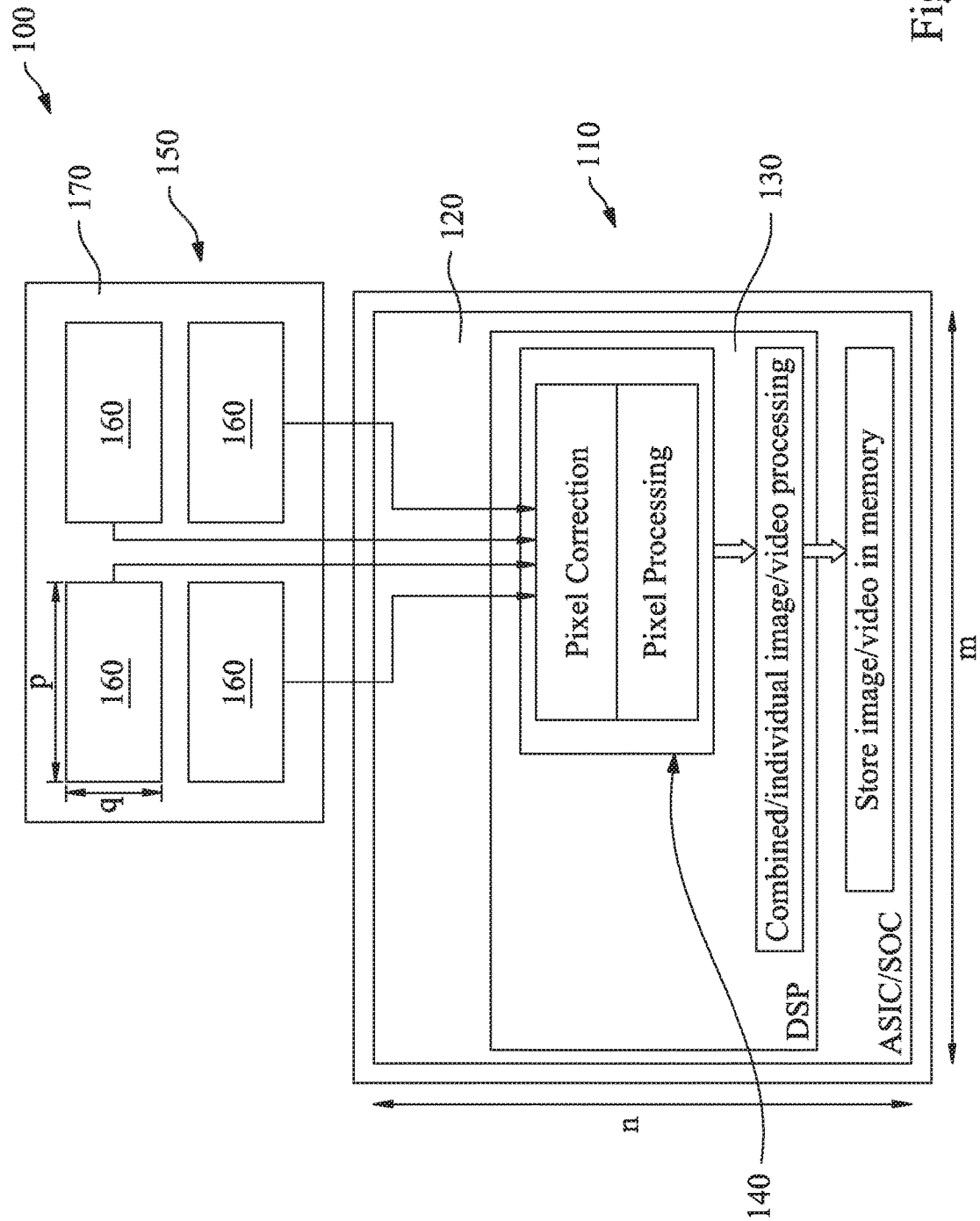
FIG. 1A is a view of a wafer on wafer (WOW) stack in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a view of a wafer on wafer (WOW) stack 100 in accordance with some embodiments. WOW stack 100 includes a first wafer 110 including a system on chip (SOC) 120. SOC 120 has a first width m and a first length n. In FIG. 1A, SOC 120 includes a digital signal processing (DSP) section 130. DSP section 130 is usable for image sensor signal processing. DSP section 130 includes a single pixel processing section 140. In some embodiments, SOC 120 includes different circuitry having a different functionality from DSP section 130. WOW stack 100 further includes a second wafer 150 bonded to first wafer 110. Second wafer 150 includes a number of dies 160. Each die 160 has a second width p and a second length q. A fill region 170 surrounds dies 160 in second wafer 150.

FIG. 1A includes first wafer 110 having a single SOC 120 for the sake of simplicity, but in fact the first wafer includes a plurality of SOCs 120. Similarly, although FIG. 1A indicates only four dies 160 in second wafer 150, the second wafer includes additional dies 160 corresponding to the plurality of SOCs 120. A number of dies on each of first wafer 110 and second wafer 150 depends on a technology node size of the dies, a diameter of the first wafer and the second wafer, and other sizing factors.

A total area of dies 160 is less than or equal to an area of SOC 120. An area of each die 160 of the plurality of dies is substantially equal. FIG. 1A includes fill region 170 separating adjacent dies 160. In some embodiments, adjacent dies 160 are in contact with one another with no fill region 170 between the adjacent dies. FIG. 1A includes an even number of dies 160. In some embodiments where second wafer 150 includes an odd number of dies 160 associated with a single SOC 120, a vacant space available relative to SOC 120 is includes a parasitic improving region. In some embodiments, the parasitic improving region includes passive elements, dummy circuitry or other suitable parasitic improving elements. In some embodiments, the parasitic improving region has a same width and length as dies 160. In some embodiments, parasitic improving region has a different width or length from dies 160.

In some embodiments, fill region 170 includes a filler material such as an underfill material, a molding compound, a dielectric material or another suitable filler material. In some embodiments, fill region 170 includes dummy circuitry. The dummy circuitry is not used to implement functionality of dies 160. The dummy circuitry helps to minimize variation across section wafer 150 during manufacturing of dies 160.

First wafer 110 is bonded to second wafer 150 using a plurality of connecting elements (not shown). In some embodiments, the connecting elements include solder bumps, copper posts, contact pads or other suitable connecting elements. The connecting elements facilitate transfer of electrical signals between dies 160 and SOC 120. FIG. 1A includes each die 160 independently transferring signals to pixel processing region 140. In some embodiments, multiple dies 160 simultaneously transfer signals to pixel processing region 140. In some embodiments, dies 160 sequentially transfer signals to pixel processing region 140. In some embodiments, at least one die 160 is inactive while at least one other die 160 is active.

In comparison with approaches which include a same die size for both circuitry on both a first wafer and a second wafer, the use of dies 160 helps to increase yield of a production process. Larger dies experience a larger amount of variation across the die during a manufacturing process. By using smaller dies, e.g., dies 160, variation within each die 160 is reduced, which in turn increases yield of the production process. Further, in some embodiments, if a die 160 is identified as faulty during a testing process, a single die is able to be replaced to produce a functioning stack. Replacing a larger die, e.g., a die having a same area as SOC 120, increases production costs and reduces yield in comparison with replacing a smaller die, e.g., die 160.

Figure 1B:
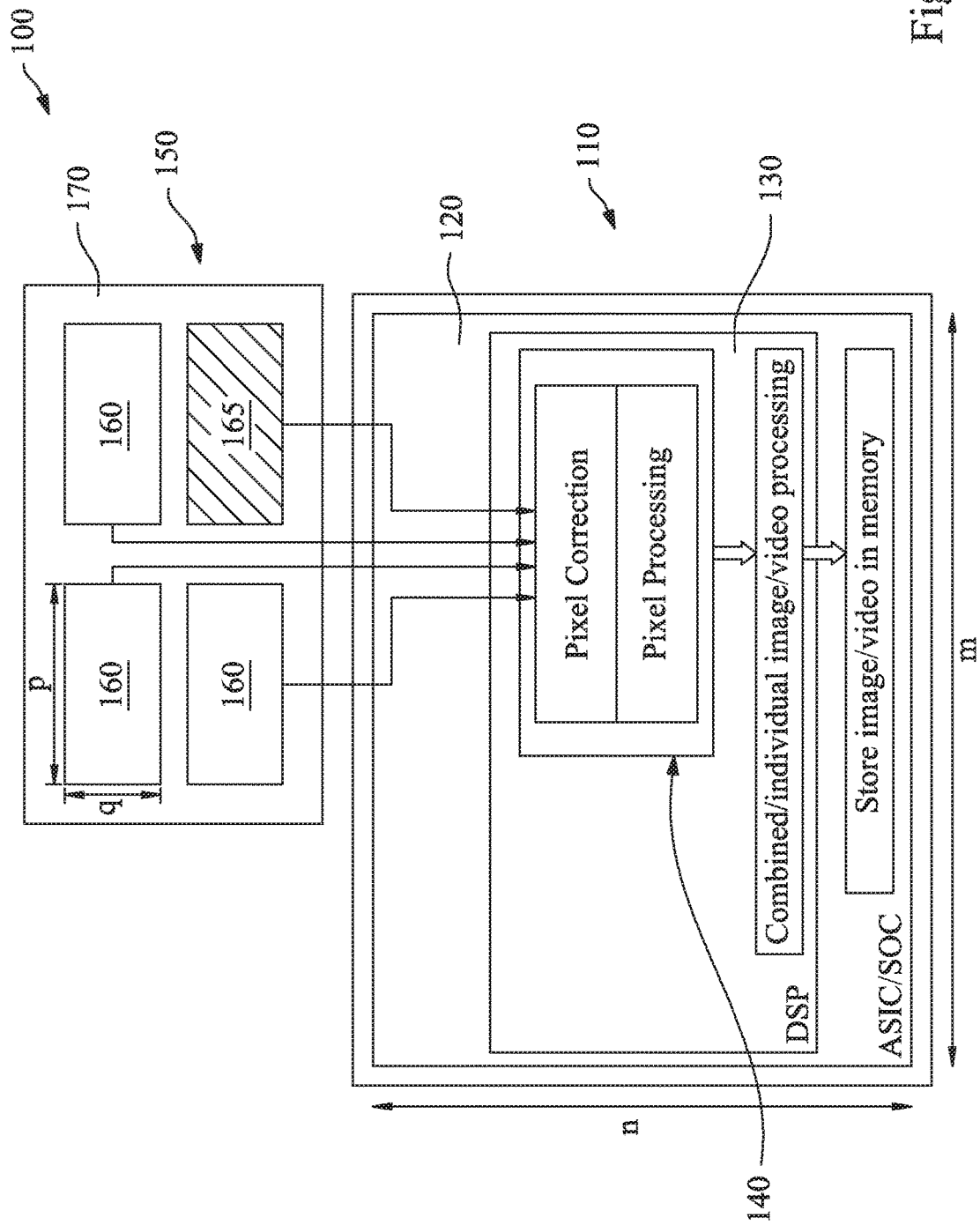
FIG. 1B is a view of a wafer on wafer (WOW) stack in accordance with some embodiments.

FIG. 1B is a view of a WOW stack 100' in accordance with some embodiments. WOW stack 100' is similar to WOW stack 100, and similar elements have a same reference number. In comparison with WOW stack 100, WOW stack 100' includes a parasitic improving region 165 in place of one of the dies 160.

Figure 2:
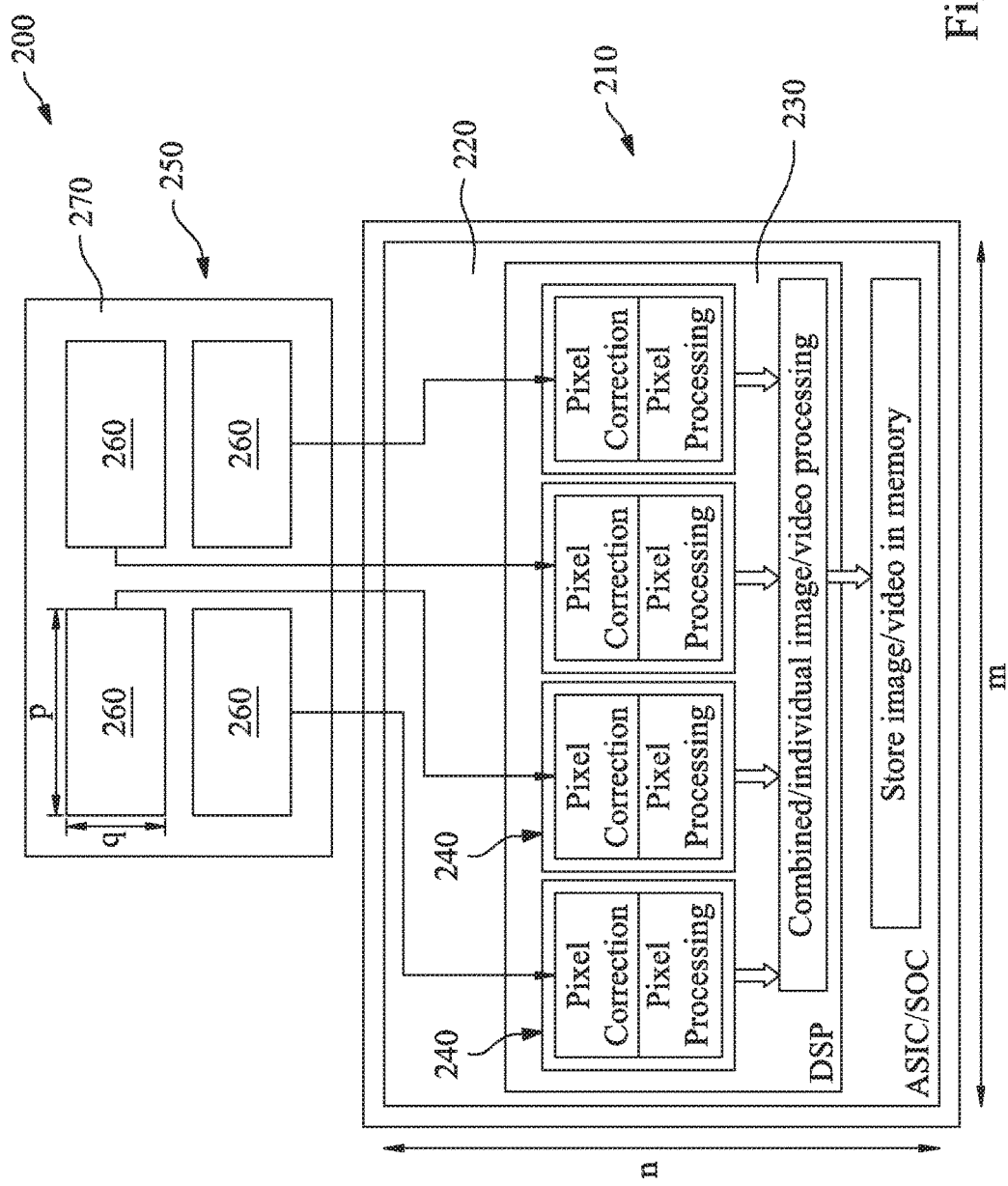
FIG. 2 is a view of a WOW stack in accordance with some embodiments.

FIG. 2 is a view of a WOW stack 200 in accordance with some embodiments. WOW stack 200 is similar to WOW stack 100, and similar elements have a same reference number increased by 100. In comparison with WOW stack 100, WOW stack 200 includes multiple of pixel processing regions 240. FIG. 2 includes a number of pixel processing regions 240 equal to a number of dies 260. In some embodiments, the number of pixel processing regions 240 is greater than or less than the number of dies 260.

The use of multiple pixel processing regions 240 helps to increase production yield for WOW stack 200 by permitting the use of re-routing of signals to account of a faulty pixel processing region 240. For example, if a first pixel processing region 240 is determined to be faulty during a testing phase or during operation, signals from a corresponding die 260 are able to be re-routed to another pixel processing region 240, in some embodiments. In some embodiments, the signals are re-routed to another pixel processing region 240 not currently in use, e.g., for sequential processing of signals from dies 260. In some embodiments, the signals are re-routed to a redundant pixel processing region 240 not previous associated with a die 260.

Figure 3:
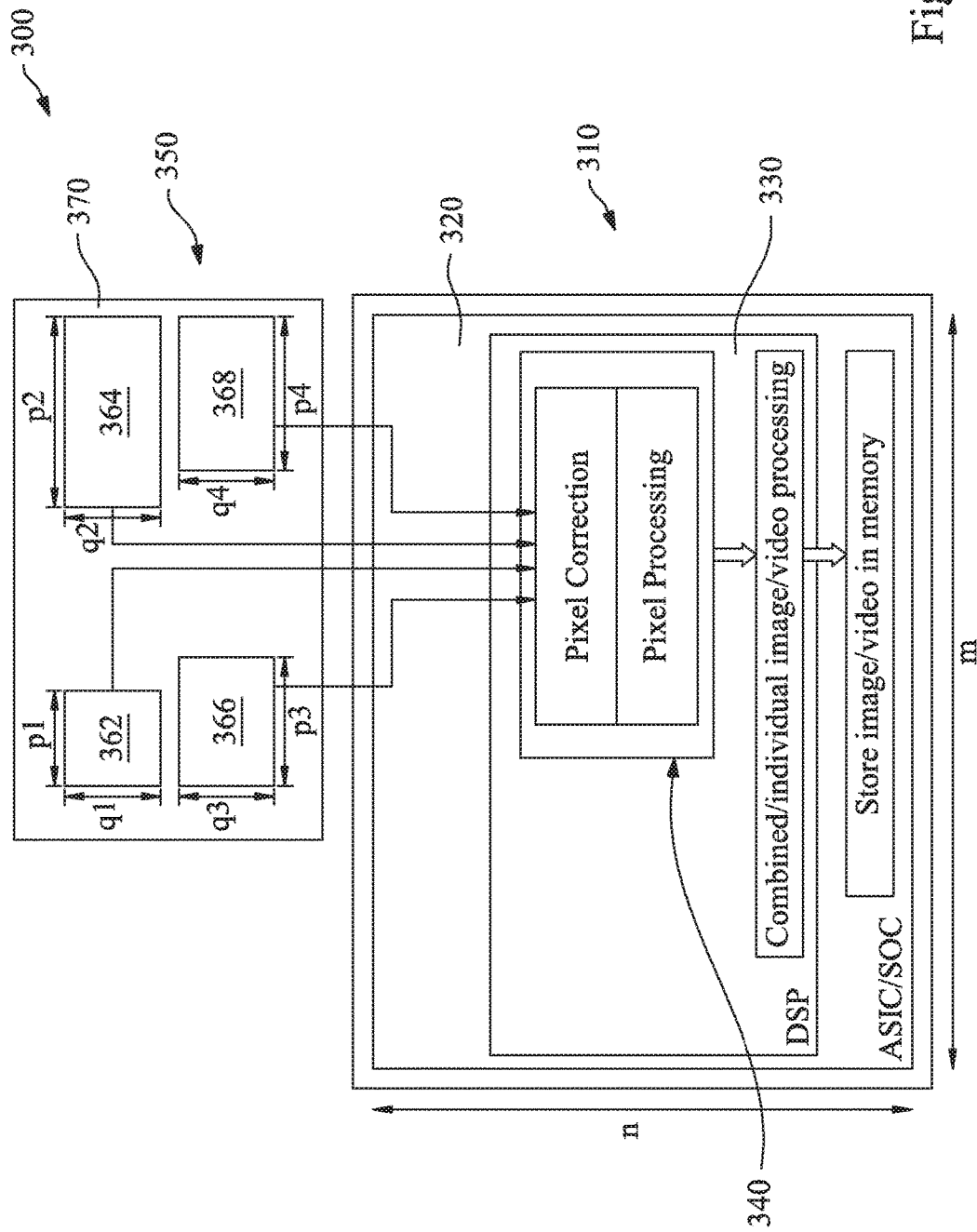
FIG. 3 is a view of a WOW stack in accordance with some embodiments.

FIG. 3 is a view of a WOW stack 300 in accordance with some embodiments. WOW stack 300 is similar to WOW stack 100, and similar elements have a same reference number increased by 200. In comparison with WOW stack 100, WOW stack 300 includes dies having different areas. WOW stack 300 includes a first die 362 having a first area p1×q1; a second die 364 having a second area p2×q2; a third die 366 having a third area p3×q3; and a fourth die having a fourth area p4×q4. A sum of the first area, the second area, the third area and the fourth area is less than an area of SOC 320. FIG. 3 includes each die 362-368 having a different size. In some embodiments, at least one die 362-368 has a same size as at least one other die 362-368

The use of dies 362-368 having different areas helps to increase a functionality of first wafer 350. For example, in an image sensor system, first die 362 is able to detect light in a first waveband, e.g., visible light, while second die 364 is able to detect light in a second waveband, e.g., infrared light, in some embodiments. The use of dies 362-368 having different areas also helps to adjust die placement in first wafer 350 to account for an oddly shaped SOC 320.

Figure 4:
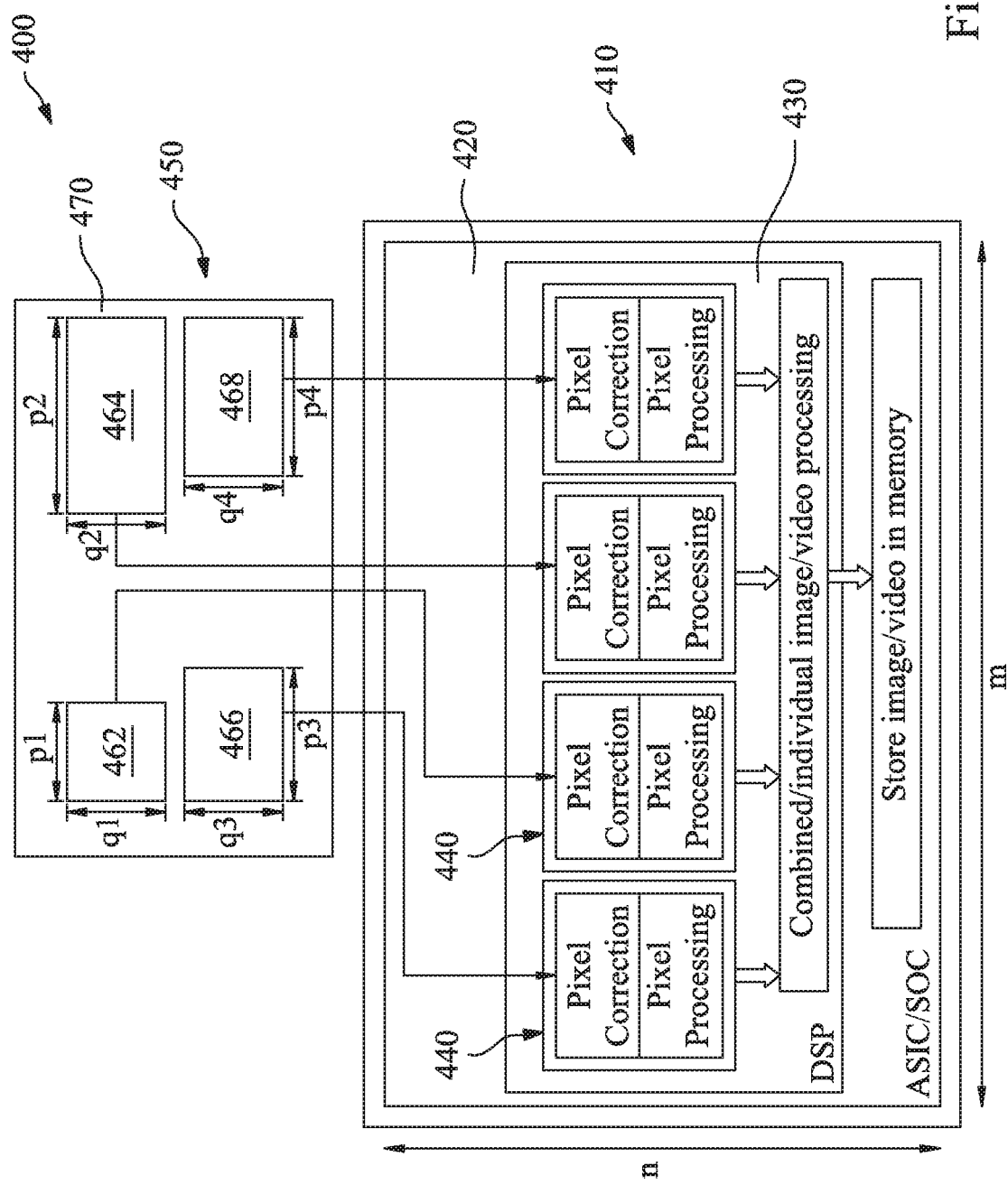
FIG. 4 is a view of a WOW stack in accordance with some embodiments.

FIG. 4 is a view of a WOW stack 400 in accordance with some embodiments. WOW stack 400 is similar to WOW stack 300, and similar elements have a same reference number increased by 100. In comparison with WOW stack 300, WOW stack 400 includes multiple of pixel processing regions 440. FIG. 4 includes a number of pixel processing regions 440 equal to a number of dies 462-468. In some embodiments, the number of pixel processing regions 440 is greater than or less than the number of dies 462-468. The inclusion of multiple pixel processing regions 440 makes increasing production yield possible, as discussed above.

Figure 5:
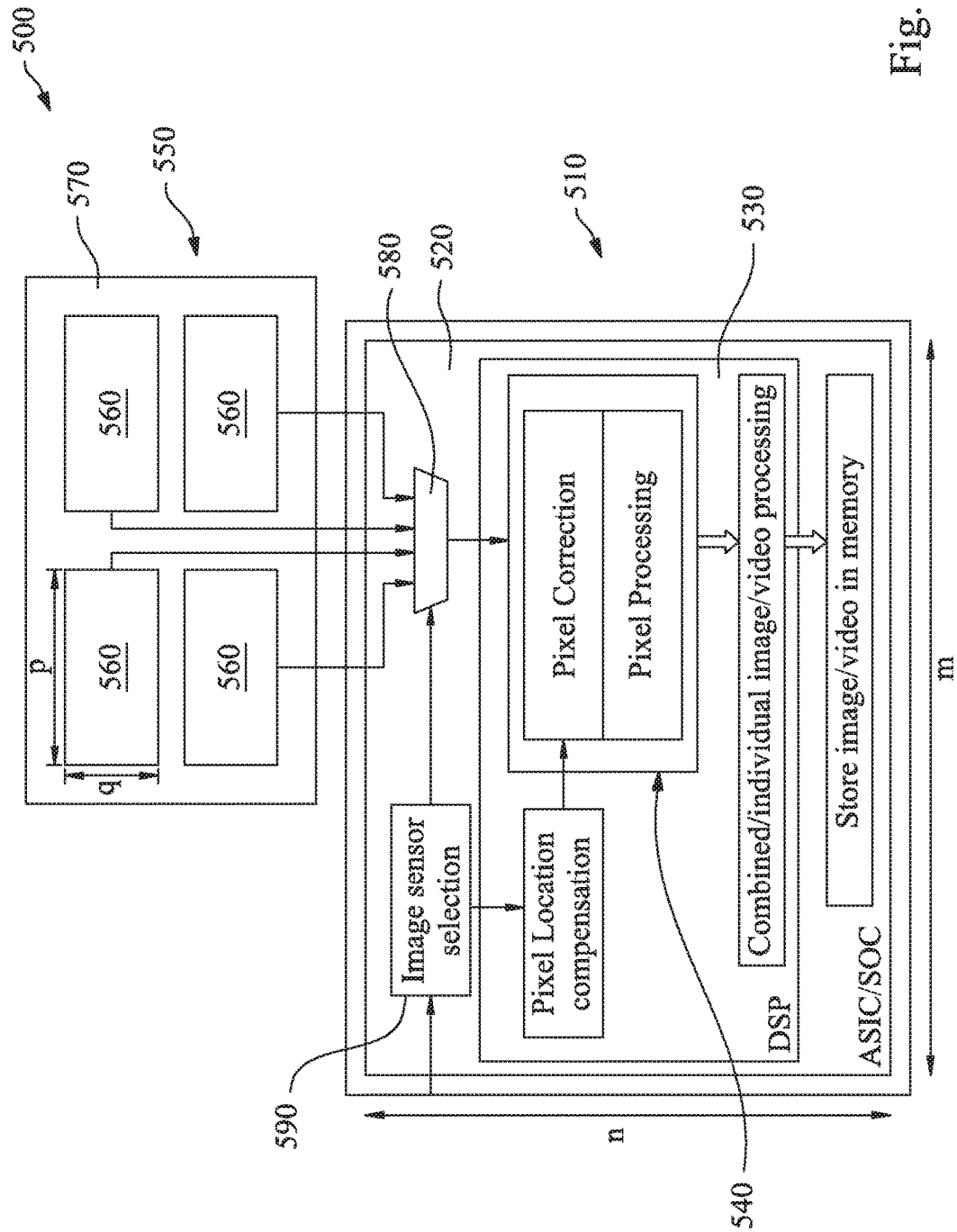
FIG. 5 is a view of a WOW stack in accordance with some embodiments.

FIG. 5 is a view of a WOW stack 500 in accordance with some embodiments. WOW stack 500 is similar to WOW stack 100, and similar elements have a same reference number increased by 400. In comparison with WOW stack 100, WOW stack 500 includes a multiplexer 580 and a selector signal generator 590. Multiplexer 580 is configured to receive signals from dies 560. Selector signal generator 590 is used to determine which signal received by multiplexer 580 is transferred to pixel processing region 540.

Multiplexer 580 and selector signal generator 590 help to facilitate sequential activation of dies 560. In some embodiments, only one die 560 is active at any given time. In some embodiments, multiple dies 560 are active at any given time. In some embodiments where less than all dies 560 are active at any given time, WOW stack 500 is able to reduce power consumption in comparison with WOW stack 100. However, where information from each die 560 is used by SOC 520, an operating speed of WOW stack 500 is increased with respect to WOW stack 100, in some embodiments.

Figure 6:
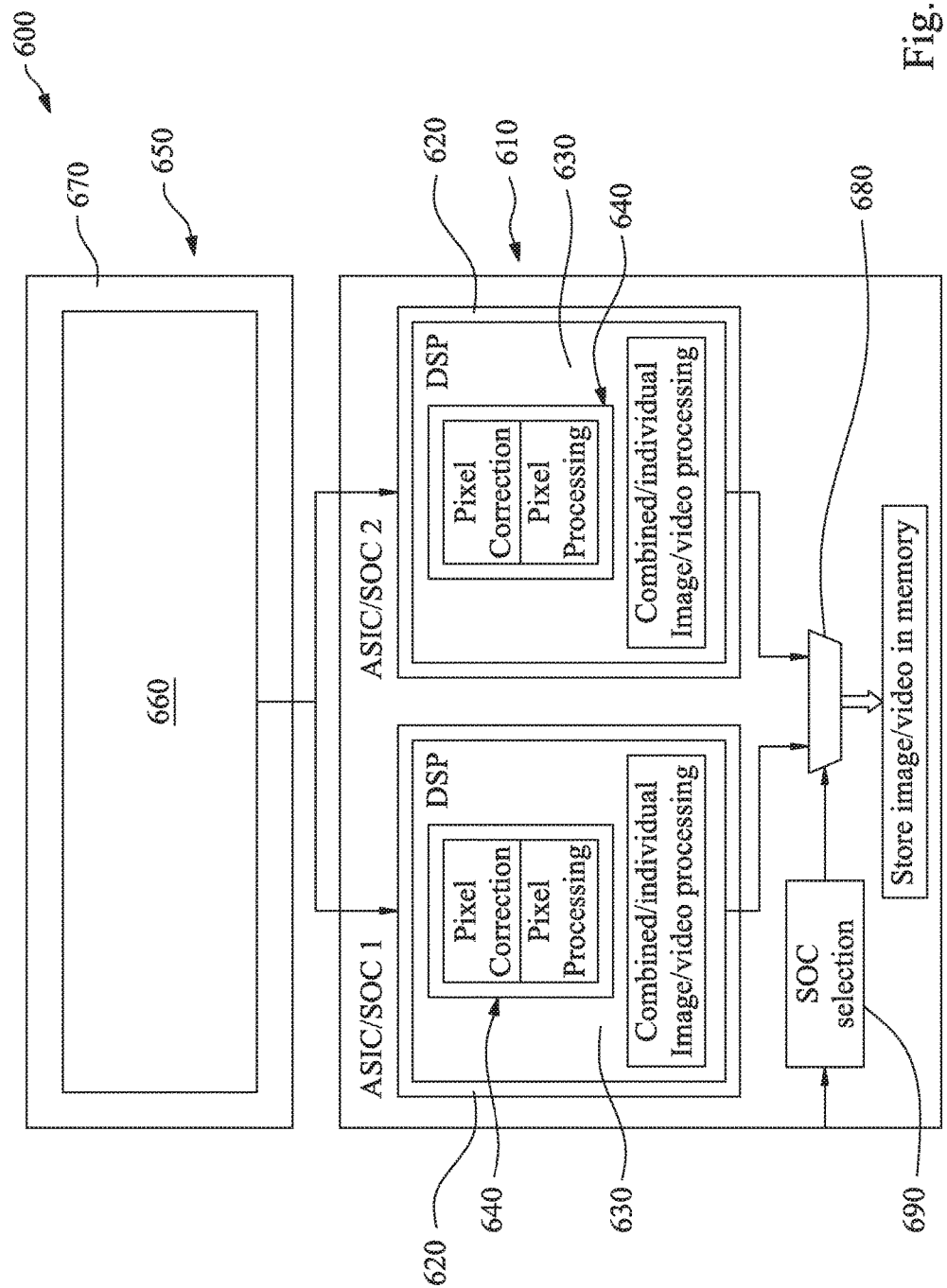
FIG. 6 is a view of a WOW stack in accordance with some embodiments.

FIG. 6 is a view of a WOW stack 600 in accordance with some embodiments. Elements in WOW stack 600 have a same reference number as similar elements in WOW stack 100 increased by 500. In comparison with WOW stack 100, WOW stack 600 includes a single die 660 on second wafer 650 and multiple SOCs 620 on first wafer 610. A total area of SOCs 620 is less than or equal to an area of die 660. Output from die 660 is provided to both SOCs 620. In some embodiments, the output from die 660 is distributed between SOCs 620 based on the connecting elements between first wafer 610 and second wafer 650. In some embodiments, the output from die 660 is distributed between SOCs 620 using a multiplexer. In some embodiments, output from die 660 is provided to less than all SOCs 620 and other SOCs 620 are used as redundant dies.

WOW stack 600 also includes a multiplexer 680 and a selector signal generator 690, similar to WOW stack 500. Multiplexer 680 is usable to selectively transfer a signal from one SOC 620 based on information received from selector signal generator 690.

Advantages for WOW stack 600 in comparison with other approaches which include a same size die on both the first wafer and the second wafer are similar to those discussed above with respect to WOW stack 100.

Figure 7:
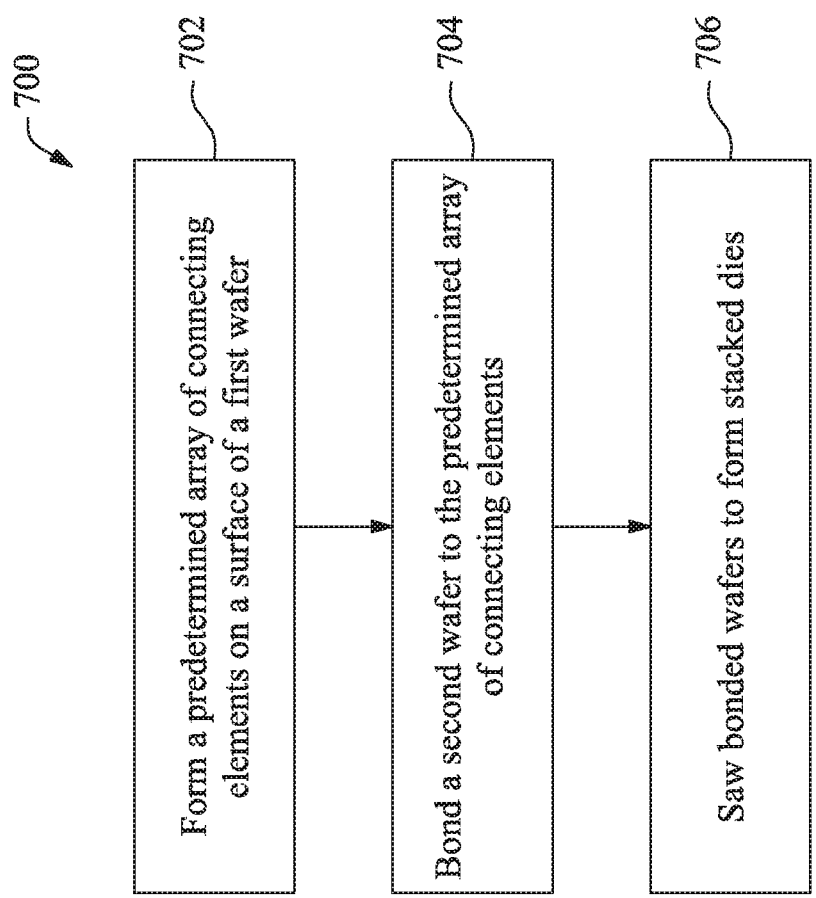
FIG. 7 is a flowchart of a method of forming a WOW stack in accordance with some embodiments.

FIG. 7 is a flowchart of a method 700 of forming a WOW stack in accordance with some embodiments. Method 700 begins with operation 702 in which a predetermined array of connecting elements are formed on a surface of a first wafer. The first wafer includes a plurality of dies of a first type. In some embodiments, the connecting elements include solder bumps, copper posts, contact pads or other suitable connecting elements. The connecting elements facilitate transfer of electrical signals between the first wafer and other wafers or devices. The predetermined array of connecting elements are arranged to facilitate bonding to a second wafer which includes a plurality of dies of a second type. The predetermined array of connecting elements maintains a same configuration regardless of whether a die of the second type has a same area as a die of the first type.

By manufacturing the first wafer with the predetermined array of connecting elements, the first wafer is able to be bonded to another wafer which includes dies having a same size as dies of the first type or to another wafer having dies with a different size from the dies of the first type. The ability to bond the first wafer to multiple different types of second wafers increases throughput and saves production costs by reducing a number of adjustment to the manufacturing process.

In operation 704, the second wafer is bonded to the predetermined array of connecting elements. In some embodiments, the bonding process includes re-flow of solder-containing elements. In some embodiments, the bonding process includes a eutectic bonding or another suitable bonding process. The second wafer includes dies of the second type. The dies of the second type have an area smaller than an area of the dies of the first type. In some embodiments, a functionality of the dies of the second type is different from a functionality of the dies of the first type.

The bonding process results in an integer number of dies of the second type to be bonded to a single die of the first type. In some embodiments, the integer number is an even number. In some embodiments, the integer number is an odd number and the second wafer also includes one or more parasitic improving regions, such as passive elements, dummy circuitry, or other suitable parasitic improving regions.

In some embodiments, all of the dies of the second type have a same area. In some embodiments, at least one die of the second type has an area different from an area of at least one other die of the second type. In some embodiments, the dies of the second type include a fill material between adjacent dies of the second type. In some embodiments, adjacent dies of the second type are in direct contact with one another.

In some embodiments, the dies of the second type include image sensing elements. In some embodiments, the dies of the second type include processing elements, such as pixel processing elements. In some embodiments, the second wafer includes a multiplexer and a selector signal generator.

In operation 706, the bonded wafers are sawed to form stacked dies. The bonded first wafer and second wafer are sawed in a same process in order to separate bonded die stacks from the bonded wafers. In some embodiments, the bonded wafers are sawed using a cutting tool, a laser or another suitable sawing device.

Figure 8:
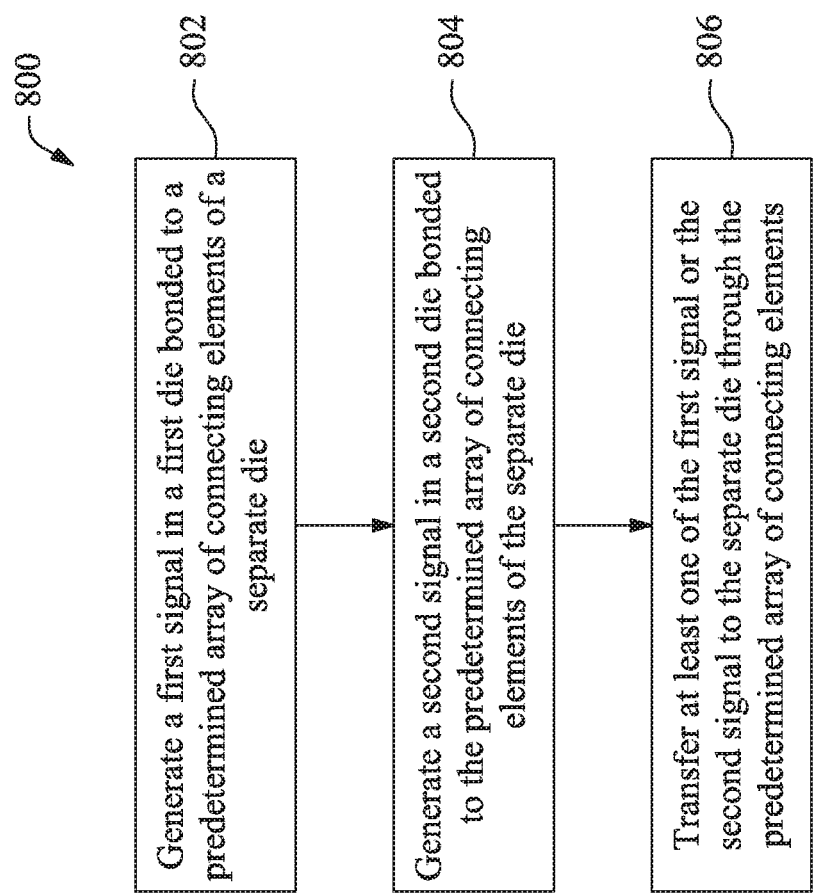
FIG. 8 is a flowchart of a method of using a circuit formed using a WOW stack in accordance with some embodiments.

FIG. 8 is a flowchart of a method 800 of using a circuit formed using a WOW stack in accordance with some embodiments. Method 800 begins with operation 802 in which a first signal is generated in a first die which is bonded to a predetermined array of connecting elements of a separate die. The first die has an area smaller than an area of the separate die. In some embodiments, the first die is a die 160 (FIG. 1A), a die 260 (FIG. 2), a die 362-368 (FIG. 3), a die 462-468 (FIG. 4), a die 560 (FIG. 5), or another suitable die. In some embodiments, the separate die is includes SOC 120, SOC 220, SOC 320, SOC 420, SOC 520, or another suitable die. In some embodiments, the signal is based on detected light energy.

In operation 804, a second signal is generated in a second die which is bonded to the predetermined array of connecting elements of the separate die. The second die has an area smaller than the area of the separate die. In some embodiments, the area of the second die is equal to the area of the first die. In some embodiments, the area of the second die is different from the area of the first die. In some embodiments, the second die is a die 160 (FIG. 1A), a die 260 (FIG. 2), a die 362-368 (FIG. 3), a die 462-468 (FIG. 4), a die 560 (FIG. 5), or another suitable die. In some embodiments, the signal is based on detected light energy.

In operation 806, at least one of the first signal or the second signal is transferred to the separate die through the predetermined array of connecting elements. In some embodiments, both the first signal and the second signal are transferred to the separate die. In some embodiments, the first signal and the second signal are transferred to the separate die simultaneously. In some embodiments the first signal and the second signal are transferred sequentially. In some embodiments, the separate die includes a pixel processing region, e.g., pixel processing region 140 (FIG. 4).

FIG. 9 is a flowchart of a method 900 of using a circuit formed using a WOW stack in accordance with some embodiments. Method 900 begins with operation 902 in which a first signal is generated in a first die having a predetermined array of connecting elements. In some embodiments, the first die is a die 660 (FIG. 6) or another suitable die. In some embodiments, the signal is based on detected light energy.

In operation 904, a second signal is generated in the first die. In some embodiments, the first die is a die 660 (FIG. 6) or another suitable die. In some embodiments, the signal is based on detected light energy.

In operation 906, the first signal is transferred to a first separate die through the predetermined array of connecting elements. An area of the first separate die is smaller than an area of the first die. In some embodiments, the first separate die is die 640 (FIG. 6), or another suitable die. In some embodiments, the first separate die includes a pixel processing region.

In operation 908, the second signal is transferred to a second separate die through the predetermined array of connecting elements. An area of the second separate die is smaller than the area of the first die. In some embodiments, the first separate die is die 640 (FIG. 6), or another suitable die. In some embodiments, the second separate die includes a pixel processing region. In some embodiments, the first signal and the second signal are transferred simultaneously. In some embodiments the first signal and the second signal are transferred sequentially. In some embodiments, the area of the first separate die is equal to the area of the second separate die. In some embodiments, the area of the first separate die is different from the area of the second separate die.

One aspect of this description relates to a method of forming a wafer on wafer (WOW) stack. The method includes forming a predetermined array of connecting elements on a surface of a first wafer, the first wafer including dies of a first type. The dies of the first type have a first functionality. The method further includes bonding a second wafer to the first wafer using the predetermined array of connecting elements, the second wafer including dies of a second type. The dies of the second type have a separate functionality different from the first functionality. Bonding the second wafer to the first wafer comprises bonding an integer number of dies of the second type to a corresponding die of the first type. A total area of the dies of the second type bonded to the corresponding die of the first type is less than or equal to an area of the corresponding die of the first type.

Another aspect of this description relates to a method of forming a wafer on wafer (WOW) stack. The method includes forming a predetermined array of connecting elements on a surface of a first wafer. The first wafer includes dies of a first type, wherein the dies of the first type have a first functionality. The method further includes bonding a second wafer to the first wafer using the predetermined array of connecting elements, the second wafer including dies of a second type. The dies of the second type have a second functionality different from the first functionality. Bonding the second wafer to the first wafer includes bonding a plurality of dies of the second type to a corresponding die of the first type. A total area of the plurality of dies of the second type bonded to the corresponding die of the first type is different from an area of the corresponding die of the first type. The method further includes sawing the bonded second wafer and first wafer to form a plurality of bonded die stacks.

Still another aspect of this description relates to a method of using a wafer-on-wafer (WOW) stack. The method includes generating a first signal in a first die of first wafer bonded to an array of connecting elements. The method further includes generating a second signal in a second die of the first wafer. The method further includes transferring the first signal to a first corresponding die of a second wafer bonded to the array of connecting elements. The method further includes transferring the second signal to a second corresponding die of the second wafer. A total area of the first die and the second die is different from a total area of the first corresponding die and the second corresponding die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a wafer on wafer (WOW) stack, the method comprising:
   forming a predetermined array of connecting elements on a surface of a first wafer, the first wafer including dies of a first type, wherein the dies of the first type have a first functionality; and
   bonding a second wafer to the first wafer using the predetermined array of connecting elements, the second wafer including dies of a second type, wherein the dies of the second type have a separate functionality different from the first functionality, wherein bonding the second wafer to the first wafer comprises bonding an integer number of dies of the second type to a corresponding die of the first type, and a total area of the dies of the second type bonded to the corresponding die of the first type is less than or equal to an area of the corresponding die of the first type.

2. The method of claim 1, further comprising sawing the bonded first and second wafers to form stacked dies.

3. The method of claim 1, wherein bonding the second wafer to the first wafer comprises bonding the second wafer where each die of the second type has a same area.

4. The method of claim 1, wherein bonding the second wafer to the first wafer comprises bonding the second wafer where at least one die of the second type bonded to the corresponding die of the first type has a different area from at least another die of the second type bonded to the die of the first type.

5. The method of claim 1, wherein bonding the second wafer to the first wafer comprises reflowing a plurality of solder containing elements.

6. The method of claim 1, wherein bonding the second wafer to the first wafer comprises bonding the second wafer including at least one parasitic improving region.

7. The method of claim 1, wherein bonding the second wafer to the first wafer comprises bonding the second wafer where dies of the second type have an image sensing functionality.

8. The method of claim 1, wherein bonding the second wafer to the first wafer comprises bonding the second wafer where dies of the second type have an image processing functionality.

9. The method of claim 1, wherein bonding the second wafer to the first wafer comprises bonding the second wafer where the dies of the second type are in direct contact with one another.

10. The method of claim 1, wherein bonding the second wafer to the first wafer comprises bonding the second wafer where the dies of the second type are separated from each other by a fill material.

11. The method of claim 1, wherein bonding the second wafer to the first wafer comprises bonding the bonding a plurality of dies of the second type to the corresponding die of the first type.

12. A method of forming a wafer on wafer (WOW) stack, the method comprising:
    forming a predetermined array of connecting elements on a surface of a first wafer, the first wafer including dies of a first type, wherein the dies of the first type have a first functionality;
    bonding a second wafer to the first wafer using the predetermined array of connecting elements, the second wafer including dies of a second type, wherein the dies of the second type have a second functionality different from the first functionality, wherein bonding the second wafer to the first wafer comprises bonding a plurality of dies of the second type to a corresponding die of the first type, and a total area of the plurality of dies of the second type bonded to the corresponding die of the first type is different from an area of the corresponding die of the first type; and
    sawing the bonded second wafer and first wafer to form a plurality of bonded die stacks.

13. The method of claim 12, wherein bonding the second wafer to the first wafer further comprises bonding a parasitic improving region to the corresponding die of the first type.

14. The method of claim 12, wherein bonding the second wafer to the first wafer comprises bonding the second wafer where each die of the plurality of dies of the second type has a different area from every other die of the plurality of dies of the second type.

15. The method of claim 12, wherein bonding the second wafer to the first wafer comprises bonding the second wafer where at least one die of the plurality of dies of the second type has a same area as another die of the plurality of dies of the second type.

16. A method of using a wafer-on-wafer (WOW) stack, the method comprising:
   generating a first signal in a first die of first wafer bonded to an array of connecting elements;
   generating a second signal in a second die of the first wafer;
   transferring the first signal to a first corresponding die of a second wafer bonded to the array of connecting elements; and
   transferring the second signal to a second corresponding die of the second wafer, wherein a total area of the first die and the second die is different from a total area of the first corresponding die and the second corresponding die.

17. The method of claim 16, wherein transferring the second signal comprises transferring the second signal simultaneously with transferring the first signal.

18. The method of claim 16, further comprising routing the second signal to the second corresponding die using a multiplexer, wherein the multiplexer is configured to receive the first signal and the second signal.

19. The method of claim 16, further comprising routing the first signal to a redundant die if the first corresponding die is faulty.

20. The method of claim 16, further comprising routing the first signal to the second corresponding die if the first corresponding die is faulty.

* * * * *